(12) United States Patent
Wu et al.

(10) Patent No.: US 10,006,787 B2
(45) Date of Patent: Jun. 26, 2018

(54) HIGH DENSITY SENSOR MODULE

(71) Applicant: ScienBiziP Consulting (Shenzhen) Co., Ltd., Shenzhen (CN)

(72) Inventors: Tsung-Ju Wu, New Taipei (TW); Jen-Tsorng Chang, New Taipei (TW); Hsin-Pei Hsieh, New Taipei (TW); Yi-Cheng Lin, New Taipei (TW)

(73) Assignee: ScienBiziP Consulting(Shenzhen)Co., Ltd., Shenzhen (CN)

( * ) Notice: Subject to any disclaimer, the term of this patent is extended or adjusted under 35 U.S.C. 154(b) by 224 days.

(21) Appl. No.: 15/155,764

(22) Filed: May 16, 2016

(65) Prior Publication Data

US 2017/0254680 A1 Sep. 7, 2017

(30) Foreign Application Priority Data

Mar. 1, 2016 (TW) .............................. 105106101 A

(51) Int. Cl.
*G01D 11/30* (2006.01)
*H05K 1/18* (2006.01)
*H05K 1/14* (2006.01)

(52) U.S. Cl.
CPC ............. *G01D 11/30* (2013.01); *H05K 1/144* (2013.01); *H05K 1/181* (2013.01); *H05K 2201/042* (2013.01); *H05K 2201/05* (2013.01); *H05K 2201/10151* (2013.01); *H05K 2201/10242* (2013.01)

(58) Field of Classification Search
CPC ................... G01D 11/30; H05K 1/144; H05K 2201/10151; H05K 2201/10242
See application file for complete search history.

(56) References Cited

U.S. PATENT DOCUMENTS

2013/0107487 A1* 5/2013 Wodnicki ............... H05K 1/144
361/784

* cited by examiner

*Primary Examiner* — Paul West
(74) *Attorney, Agent, or Firm* — ScienBiziP, P.C.

(57) ABSTRACT

A high density sensor module includes a first substrate, a plurality of first sensors positioned on the first substrate, a plurality of first conductive rods positioned on the corresponding first sensors, a first package resin member covering the first sensors and one end of each of the first conductive rods, a second substrate positioned on the first package resin member, a plurality of second sensors positioned on the second substrate, and a second package resin member covering the second sensors and another end of each of the first conductive rods. The first conductive rods pass through the first package resin member and the second substrate. The high density sensor module has a two-layer structure to increase the number of the sensors such that the sensing density and resolution of the high-density sensor module are increased.

15 Claims, 2 Drawing Sheets

HIGH DENSITY SENSOR MODULE

FIELD

The subject matter herein generally relates to a high density sensor module.

BACKGROUND

In the field of automation and mobile device applications, sensors are used to monitor or control user interfaces and functions of hardware devices. The sensor module is normally arranged in a single layer structure or as a single discrete component. In modern applications, a higher number of sensor modules may be needed to increase the sensitivity and resolution. However, large quantity of sensor modules occupies a great amount of space in a device, which may post a challenge to device miniaturization.

BRIEF DESCRIPTION OF THE DRAWINGS

Implementations of the present technology will now be described, by way of example only, with reference to the attached figures.

DETAILED DESCRIPTION

Figure 1:
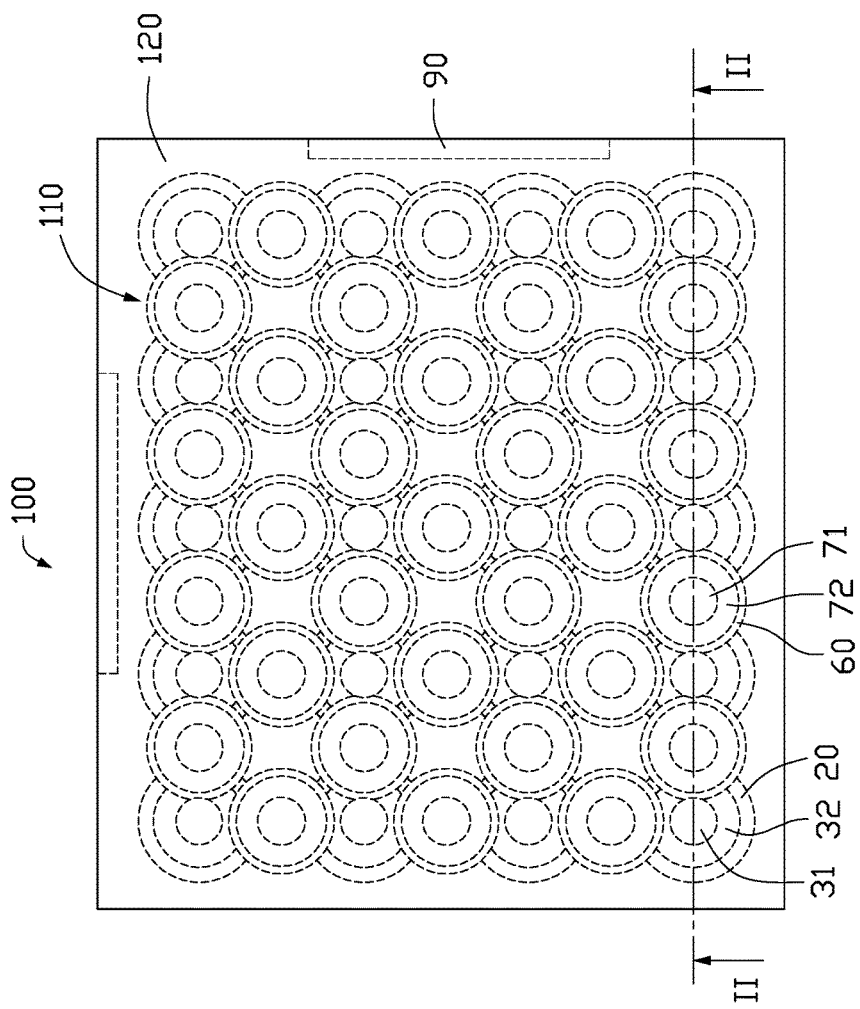
FIG. 1 is a diagrammatic planar view of a high density sensor module.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 provides a diagrammatic planar view illustrating a high density sensor module 100 in accordance with embodiments of the instant disclosure, which includes a sensing region 110 and a non-sensing region 120 surrounding the sensing region 110.

Figure 2:
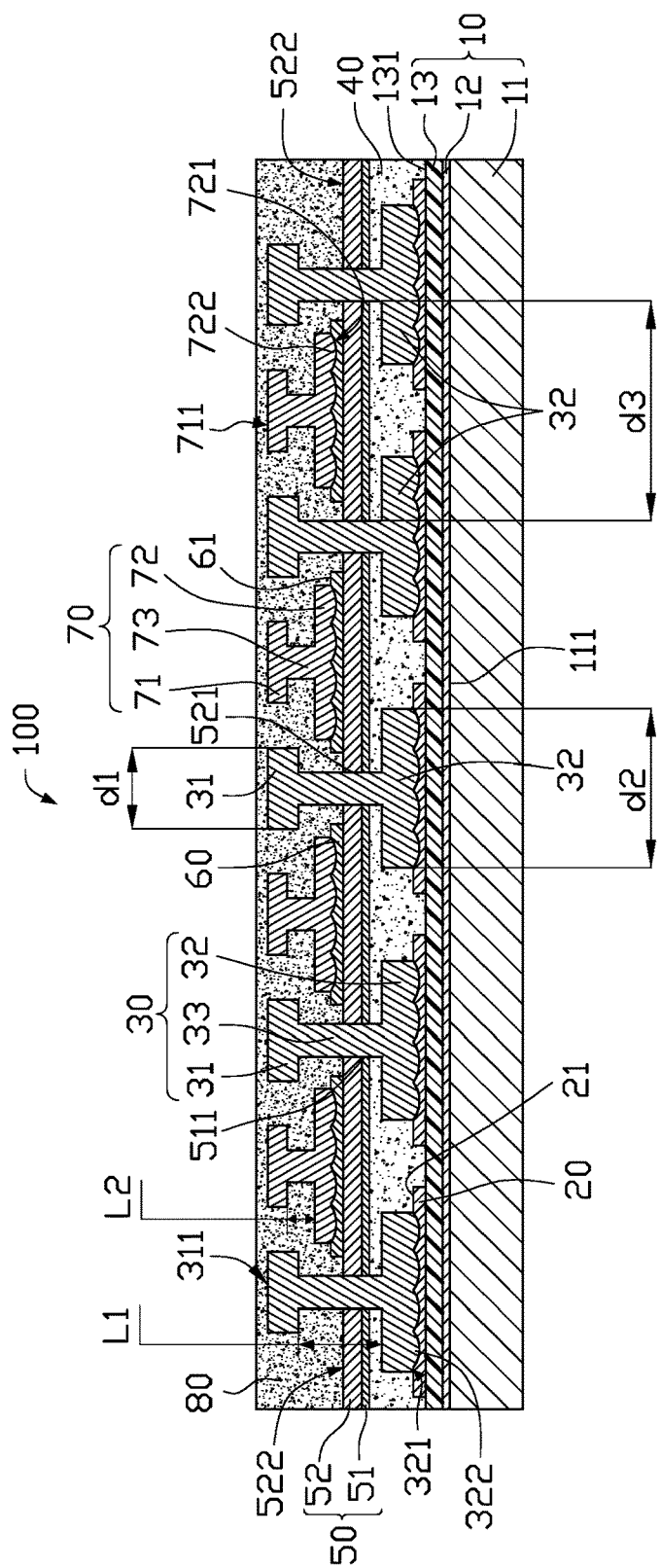
FIG. 2 is a cross-sectional view of the high density sensor module along the line II-II in FIG. 1.

FIG. 2 illustrates the cross-section of the high density sensor module 100 along the line II-II in FIG. 1. The high density sensor module 100 includes a first substrate 10, a plurality of first sensors 20, a plurality of first conductive rods 30, a first package resin member 40, a second substrate 50 formed on the first package resin member 40, a plurality of second sensors 60, a plurality of second conductive rods 70, and a second package resin member 80 formed on the second substrate 50.

The first substrate 10 includes a supporting substrate 11 with a first surface 111, a first buffer layer 12 formed on the first surface 111 of the supporting substrate 11, and a first flexible printed circuit board 13 formed on a surface of the first buffer layer 12 away from the supporting substrate 11. The supporting substrate 11 is a non-elastic substrate. The supporting substrate 11 can be made of glass, metal, or plastic sheets. The first buffer layer 12 is formed on the first surface 111 of the supporting substrate 11. The first buffer layer 12 is mainly used to fix the first flexible printed circuit board 13 and functions as a buffer for absorbing external forces. The first buffer layer 12 can be made of thermoplastic polyurethane (TPU), polydimethylsiloxane (PDMS), silicone, or rubber. The first flexible printed circuit board 13 includes a first mounting surface 131. The first mounting surface 131 faces away from the first surface 111 and is substantially parallel to the first surface 111.

The plurality of first sensors 20 are periodically arranged in an array and distributed over the first mounting surface 131 of the first flexible printed circuit board 13. The plurality of first sensors 20 electrically connect to the flexible printed circuit board 13. Each of the first sensors 20 includes a first sensing surface 21 facing away from the first mounting surface 131 and substantially parallel to the first mounting surface 131. In at least one embodiment, each of the first sensors 20 is a pressure sensor.

The plurality of first conductive rods 30 are formed on the plurality of first sensors 20. Each of the first conductive rods 30 is respectively positioned on the first sensing surface 21 of each of corresponding first sensors 20. In the instant example, each of the first conductive rods 30 comprises a substantially I-shaped longitudinal cross-sectional profile. Each of the conductive rods 30 includes a first upper horizontal portion 31, a first lower horizontal portion 32, and a first vertical portion 33 connecting the first upper horizontal portion 31 and the first lower horizontal portion 32. The first lower horizontal portion 32 is opposed to the first upper horizontal portion 31. In the exemplary embodiment and as shown most clearly in FIGS. 1, 31, 32, and 33 are each circular in cross section.

The first upper horizontal portion 31 includes a first upper surface 311. The first upper surface 311 is a planar surface and is arranged substantially parallel to the sensing surface 21. The first upper surface 311 is arranged away from the first vertical portion 33. The first lower horizontal portion 32 includes a first lower surface 321. The first lower surface 321 is parallel to the first upper surface 311 and arranged away from the first vertical portion 33. The first upper horizontal portion 31, the first lower horizontal portion 32, and the first vertical portion 33 can be either an integrally molded or a separately jointed unit. In at least one embodiment, the first upper horizontal portion 31, the first lower horizontal portion 32, and the first vertical portion 33 are integrally molded. The planar shapes of the sensing surface 21 and the first upper surface 311 are circular. In other embodiments, the planar shapes of the sensing surface 21 and the first upper surface 311 can be square, oval, and the like.

In the instant example, a width of the first upper horizontal portion 31 for each of the first conductive rods 30 is defined as d1. A width of the first lower horizontal portion 32 for each of the first conductive rods 30 is defined as d2. A distance between two adjacent first vertical portions 32 is defined as d3. The relation of d1, d2 and d3 is d3≥d2>d1. In at least one embodiment, d3 is larger than d2.

The first lower surface 321 includes a plurality of micro structures 322. In at least one embodiment, the micro structures 322 are rounded projections. The plurality of micro structures 322 increase the contact areas between the first lower surface 321 and the sensing surface 21, so that the force exerted on the second sensor 20 may be transferred more uniformly to the contact areas to increase the pressure endurance of the second sensor 20. Thus, the sensing accuracy of the first sensor 20 may be increased. In other embodiments, the first lower surface 321 can be a flat surface.

The first package resin member 40 is positioned on the first mounting surface 131 of the first flexible printed circuit board 13. In the instant example, the first package resin member 40 substantially completely covers the first mounting surface 131 of the first flexible printed circuit board 13, the plurality of first sensors 20, the plurality of first lower horizontal portions 32, and a portion of the first vertical portions 33. The first package resin member 40 covers one end of each of the first vertical portions 33.

In at least one embodiment, the first package resin member 40 is formed by injection molding. The material of the first package resin member 40 is a flexible or elastic material. In the present embodiment, the material of the first package 40 is a colloid. The first package resin member 40 is prevents the first sensor 20 from being subject to outside interference and damage, thereby extending the life cycle of the first sensor 20.

The second substrate 50 includes a second buffer layer 51 and a second flexible printed circuit board 52 positioned on a surface of the second buffer layer 51.

The second buffer layer 51 is formed on a surface of the first package resin member 40 away from the first flexible printed circuit board 13. The second buffer layer 51 includes a plurality of first openings 511. First openings 511 will have the same cross-section as vertical portion 33. Thus, in the shown exemplary embodiment, first openings 511 are circular when viewed from above.

The second flexible printed circuit board 52 includes a plurality of second openings 521. The positions of the second openings 521 are corresponding to the positions of the first openings 511. The plurality of vertical portions 33 of first conductive rods 30 are respectively accommodated in the plurality of first openings 511 and second openings 521. The second flexible printed circuit board 52 also includes a second mounting surface 522. The second mounting surface 522 of the second flexible printed circuit board 52 is arranged facing away from the first package resin member 40.

The plurality of second sensors 60 are positioned on the second mounting surface 522 of the second flexible printed circuit board 52 and electrically connected to the second flexible printed circuit board 52. Each of the second sensors 60 is located between two adjacent second openings 521. Each of the second sensors 60 includes a second sensing surface 61 facing away from the second flexible printed circuit board 52. In at least one embodiment, the second sensor 60 is a pressure sensor. The projection of the second sensing surface 61 of the second sensor 60 on the first surface 111 is partially overlapped with a planar projection of the first sensing surface 21 of the first sensor 20 on the first surface 111. In at least one embodiment, the first upper surface 311 of the first upper horizontal portion 31 of the first conductive rod 30 can be flush with the second sensing surface 61 of the second sensor 60.

The second package resin member 80 is positioned on the second mounting surface 522 of the second flexible printed circuit board 52. In the instant example, the second package resin member 80 completely covers the second mounting surface 522 of the second flexible printed circuit board 52, the first upper horizontal portions 31 and a portion of the first vertical portions 33 of the plurality of first conductive rods 30, and the plurality of second sensors 60. In at least one embodiment, the second package resin member 80 is formed by injection molding. The second package resin member 80 is made of a flexible or elastic material. In at least one embodiment, the second package resin member 80 is made of a colloid. The second package resin member 80 is prevents the second sensor 60 from being subjected to outside interference and damage, thereby extending the life cycle of the second sensor 60.

In at least one embodiment, the plurality of first sensors 20, the plurality of first conductive rods 30, the plurality of second sensors 60, a portions of the first substrate 10, the first package resin 40, the second substrate 50, and the second package resin member 80 are combined as a sensing region 110. A portion of the first substrate 10, the first package resin 40, the second substrate 50 and the second package resin member 80 surrounding the sensing region 110 are formed as a portion of the non-sensing region 120.

The high-density sensor module 100 further includes at least one connecting portion 90 located within the non-sensing region 120. The connecting portion 90 electrically connects with the first flexible printed circuit board 13 and the second flexible printed circuit board 52. The connecting portion 90 includes an interface exposed to the outside of the high-density sensor module 100. The connecting portion 90 is used to output the signals sensed and measured by the first sensors 20 and the second sensors 60.

The high-density sensor module 100 further includes a plurality of second conductive rods 70. The plurality of second conductive rods 70 are respectively positioned on the second sensing surfaces 61 of the plurality of the second sensors 60. Each of the second conductive rods 70 has a substantially same structure as each of the first conductive rods 30. Each of the second conductive rods 70 includes a second upper horizontal portion 71, a second lower horizontal portion 72, and a second vertical portion 73. The second upper horizontal portion 71 includes a second upper surface 711 and the second lower horizontal portion 72 includes a second lower surface 721. The second lower surface 721 can be a flat surface or other shaped surface. In at least one embodiment, both of the first lower surface 321 and the second lower surface 721 are flat surfaces. The second lower surface 721 can include a plurality of micro structures 722 which are rounded surfaces.

The difference between the structures of the second conductive rods 70 and the first conductive rods 30 is primarily that the length of each of the second vertical portions 73 is shorter than the length of each of the first vertical portions 33. The length of each of the first vertical portions of the first conductive rods 30 is L1, the length of each of the second vertical portion 73 of the second conductive rods 70 is L2, and the relation of L1 and L2 is L1>L2.

The second upper horizontal portions 71 of the second conductive rods 70 and the first upper horizontal portion 31 of the first conductive rods 30 are alternatively distributed in the high density sensor module 100. Each of the second upper surfaces (711) of the second upper horizontal portions 71 is flush with each of the first upper surfaces (311).

For the high density sensor module 100 with the plurality of second conductive rods 70, the second package resin member 80 substantially completely covers the plurality of second conductive rods 70. In at least one embodiment, the sensing region 110 is formed by the combination of the plurality of first sensors 20, the plurality of first conductive rods 30, the plurality of second sensors 60, the plurality of second conductive rods 70 and the portions of the first substrate 10 corresponding to the plurality of second conductive rods 70, the first package resin 40, the second substrate 50, and the second package resin member 80. In addition, the non-sensing region 120 is formed by a portion of the first substrate 10, the first package resin 40, the second substrate 50, and the second package resin member 80 surrounding the sensing region 110.

When the high-density sensor module 100 is experienced a pressure from outside, the pressure over the first conductive rod 30 and/or the second conductive rod 70 is conducted to the corresponding first sensors 20 and the second sensors 60. The first sensors 20 and the second sensors 60 sense the pressure and generate pressure signals. The pressure signals can be converted into electrical signals or other forms signals by the first sensor 20 and the second sensor 60 according to certain rules. The electrical or other forms of signals are then output through the connecting portion 90.

In at least one embodiment, the high density sensor module 100 has a two-layer structure to increase the number of sensors, thereby increasing the sensing density and sensing resolution of the high-density sensor module 100. In addition, a plurality of first sensors 20 and second sensors 60 are periodically alternated arrangements and spaced from each other to increase the distribution densities of the first sensors 20 and the second sensors 60. All of the first sensors 20 and the second sensors 60 are independent of each other to ensure the independences of the sensors.

The embodiments shown and described above are only examples. Many details are often found in the art such as the other features of a sensor module. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A high-density sensor module comprising:
a first substrate comprising a supporting substrate, the supporting substrate includes a first surface;
a plurality of first sensors positioned on the first substrate;
a plurality of first conductive rods positioned on the plurality of first sensors, each of the plurality of the first conductive rods are respectively corresponding to each of the plurality of the first sensors;
a first package resin member covering the plurality of the first sensors and one end of each of the first conductive rods;
a second substrate positioned on the first package resin member, wherein the plurality of first conductive rods pass through the first package resin member and the second substrate;
a plurality of second sensors positioned on the second substrate, the plurality of second sensors and first sensors being periodically alternately arranged, wherein the projections of the second sensing surfaces of the second sensors overlaps with the projections of the first sensing surfaces of the first sensors; and
a second package resin member covering the plurality of second sensors and another end of each of the plurality of first conductive rods.

2. The high density sensor module of claim 1, wherein the first substrate further comprises a first buffer layer formed on the first surface of the supporting substrate and a first flexible printed circuit board formed on a surface of the first buffer layer away from the first surface of the supporting substrate, the first flexible printed circuit board comprises a mounting surface parallel to the first surface and away from the first surface, the plurality of first sensors are distributed as a array on the first mounting surface and electrically connected to the first flexible printed circuit board.

3. The high density sensor module of claim 2, wherein each of the first conductive rods is substantially "I"-shaped and comprises a first upper horizontal portion, a first lower horizontal portion, and a first vertical portion connecting between the first upper horizontal portion and the first lower horizontal portion, the first upper horizontal portion comprises a first upper surface away from the first vertical portion, and the first lower horizontal portion comprises a first lower surface parallel to the first upper surface and away from the first vertical portion.

4. The high density sensor module of claim 3, wherein the second substrate comprises a second buffer layer and a second flexible printed circuit board formed on a surface of the second buffer layer, the plurality of second sensors are positioned on the second flexible printed circuit board.

5. The high density sensor module of claim 3, wherein a width of the first upper horizontal portion for each of the first conductive rods is d1, a width of the first lower horizontal portion for each of the first conductive rods is d2, a distance between two adjacent first vertical portions is d3, and d3≥d2>d1.

6. The high density sensor module of claim 3, wherein the first lower surface for each of the first lower portions of the first conductive rods contacts with the corresponding first sensing surface for each of the plurality of the first sensors, and the first lower surfaces comprises a plurality of micro structures.

7. The high density sensor module of claim 3, wherein each of the second sensors comprises a second sensing surface, the second sensing surface is substantially flush with the first upper surface of the first horizontal portion.

8. A high-density sensor module comprising:
a first substrate comprising a supporting substrate, the supporting substrate comprises a first surface;
a plurality of first sensors positioned on the first substrate;
a plurality of first conductive rods positioned on the plurality of first sensors, each of the plurality of first conductive rods are respectively corresponding to each of the plurality of the first sensors;
a first package resin member covering the plurality of first sensors and one end of each of the plurality of first conductive rods;
a second substrate positioned on the first package resin member, wherein the plurality of first conductive rods pass through the first package resin member and the second substrate;
a plurality of second sensors positioned on the second substrate, the plurality of second sensor and first sensor being periodically alternately arranged, wherein the projections of the second sensing surfaces of the second sensors overlaps with the projections of the first sensing surfaces of the first sensors;
a plurality of second conductive rods positioned on the plurality of second sensors, each of the plurality of second conductive rods are respectively corresponding to each of the plurality of second sensors; and a second package resin member covering the plurality of second sensors and another end of each of the plurality of first conductive rods.

9. The high density sensor module of claim 8, wherein the first substrate further comprises a first buffer layer formed on the first surface of the supporting substrate and a first flexible printed circuit board formed on a surface of the first buffer layer away from the first surface of the supporting substrate, the first flexible printed circuit board comprises a mounting surface parallel to the first surface and away from the first surface, the plurality of first sensors are distributed as a array on the first mounting surface and electrically connected to the first flexible printed circuit board.

10. The high density sensor module of claim 9, wherein each of the plurality of first conductive rods is substantially "I"-shaped and comprises a first upper horizontal portion, a first lower horizontal portion, and a first vertical portion connecting between the first upper horizontal portion and the first lower horizontal portion, the first upper horizontal portion comprises a first upper surface away from the first vertical portion, and the first lower horizontal portion comprises a first lower surface parallel to the first upper surface and away from the first vertical portion.

11. The high density sensor module of claim 10, wherein a width of the first upper horizontal portion for each of the plurality of first conductive rods is d1, a width of the first lower horizontal portions for each of the plurality of first conductive rods is d2, a distance between two adjacent first vertical portions is d3, and d3≥d2>d1.

12. The high density sensor module of claim 10, wherein the first lower surface for each of the first lower portions of the first conductive rods contacts with the corresponding first sensing surface for each of the plurality of the first sensors, and the first lower surfaces comprises a plurality of micro structures.

13. The high density sensor module of claim 10, wherein the second substrate comprises a second buffer layer and a second flexible printed circuit board positioned on a surface of the second buffer layer, the plurality of second sensors are positioned on the second flexible printed circuit board.

14. The high density sensor module of claim 10, wherein each of the second conductive rods comprises a second upper horizontal portion, a second lower horizontal portion and a second vertical portion connecting between the first and second horizontal portions, the second upper horizontal portion comprises a second upper surface away from the second vertical portion, each of the second upper surfaces of the second upper horizontal portions is substantially flush with each of the first upper surfaces.

15. The high density sensor module of claim 10, wherein the second package resin member covers the plurality of second conductive rods.

* * * * *